United States Patent
Han et al.

(10) Patent No.: US 9,431,575 B2
(45) Date of Patent: Aug. 30, 2016

(54) LIGHT-EMITTING DEVICE

(71) Applicant: LG INNOTEK CO., LTD., Seoul (KR)

(72) Inventors: Dae Seob Han, Seoul (KR); Yong Tae Moon, Seoul (KR); Kwang Sun Baek, Seoul (KR); A Ra Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/434,383

(22) PCT Filed: Oct. 8, 2013

(86) PCT No.: PCT/KR2013/009013
§ 371 (c)(1),
(2) Date: Apr. 8, 2015

(87) PCT Pub. No.: WO2014/058224
PCT Pub. Date: Apr. 17, 2014

(65) Prior Publication Data
US 2015/0270436 A1    Sep. 24, 2015

(30) Foreign Application Priority Data

Oct. 9, 2012 (KR) .................. 10-2012-0111842

(51) Int. Cl.
*H01L 29/88* (2006.01)
*H01L 29/861* (2006.01)
(Continued)

(52) U.S. Cl.
CPC ........... *H01L 33/06* (2013.01); *H01L 33/0025* (2013.01); *H01L 33/04* (2013.01); *H01L 33/145* (2013.01); *H01L 33/32* (2013.01); *H01L 33/22* (2013.01); *H01L 2224/48091* (2013.01)

(58) Field of Classification Search
CPC . H01L 21/041; H01L 21/045; H01L 21/048; H01L 21/0257; H01L 21/02576; H01L 21/02579; H01L 21/3242; H01L 27/0814; H01L 27/07; H01L 29/6603; H01L 29/106; H01L 51/5296; H01L 51/102; H01L 51/0649; H01L 51/4226; C23C 14/086; C23C 16/301

USPC ......... 257/13, 77, 79, 87, 88, 104, 200, 201, 257/288, 441, 607, 615, 631, 744, E21.005, 257/E21.006, E21.041, E21.045, E21.053, 257/E21.077, E21.084, E21.126, E21.127, 257/E21.267, E21.352, E21.366

See application file for complete search history.

(56) References Cited

U.S. PATENT DOCUMENTS 7,279,717 B2 * 10/2007 Yamada ................ B82Y 20/00
257/97
7,402,838 B2 * 7/2008 Tanizawa ............... B82Y 20/00
257/94

(Continued)

FOREIGN PATENT DOCUMENTS

DE    10 2006 046 227 A1    1/2008
EP         1 670 106 A1    6/2006

(Continued)

OTHER PUBLICATIONS

Chung et al., " Performance Improvements in InGaN/GaN light-emitting diodes using electron blocking layer with V-Shaped graded Al Composition," Superlattices and Microstructures, vol. 75, pp. 390-397, Aug. 8, 2014.

*Primary Examiner* — David Nhu
(74) *Attorney, Agent, or Firm* — Birch, Stewart, Kolasch & Birch, LLP

(57) ABSTRACT

The embodiment relates to a light-emitting device, a method of manufacturing the same, a light-emitting device package, and a lighting system. A light-emitting device according to the embodiment may include: a first conductive semiconductor layer; a gallium nitride-based superlattice layer on the first conductive semiconductor layer; an active layer on the gallium nitride-based superlattice layer; a second conductive gallium nitride-based layer on the active layer; and a second conductive semiconductor layer on the second conductive gallium nitride-based layer. The second conductive gallium nitride-based layer may include a second conductive GaN layer having a first concentration, a second conductive $In_xAl_yGa_{(1-x-y)}N$ ($0<x<1$, $0<y<1$) layer having a second concentration and a second conductive $Al_zGa_{(1-z)}N$ ($0<z<1$) layer having a third concentration on the active layer.

20 Claims, 9 Drawing Sheets

(51) Int. Cl.
   *H01L 33/06*   (2010.01)
   *H01L 33/04*   (2010.01)
   *H01L 33/32*   (2010.01)
   *H01L 33/00*   (2010.01)
   *H01L 33/14*   (2010.01)
   *H01L 33/22*   (2010.01)

(56) References Cited

U.S. PATENT DOCUMENTS

| | | | |
|---|---|---|---|
| 7,692,182 B2* | 4/2010 | Bergmann | B82Y 20/00 257/22 |
| 7,888,670 B2* | 2/2011 | Han | H01L 33/06 257/13 |
| 2007/0063207 A1 | 3/2007 | Tanizawa et al. | |
| 2007/0290230 A1 | 12/2007 | Kawaguchi et al. | |
| 2008/0054247 A1 | 3/2008 | Eichler et al. | |
| 2008/0251781 A1 | 10/2008 | Han et al. | |
| 2012/0145993 A1 | 6/2012 | Na et al. | |
| 2015/0287876 A1* | 10/2015 | Han | H01L 33/06 257/13 |

FOREIGN PATENT DOCUMENTS

| | | |
|---|---|---|
| EP | 1 883 141 A1 | 1/2008 |
| JP | 2001-210861 A | 8/2001 |
| JP | 4815732 B2 | 11/2011 |
| KR | 10-0835116 B1 | 6/2008 |
| KR | 10-2009-0058364 A | 6/2009 |
| KR | 10-0979701 B1 | 9/2010 |

* cited by examiner

LIGHT-EMITTING DEVICE

CROSS REFERENCE TO RELATED APPLICATIONS

This application is the National Phase of PCT/KR2013/009013 filed on Oct. 8, 2013, which claims priority under 35 U.S.C. 119(a) to Patent Application No. 10-2012-0111842 filed in the Republic of Korea on Oct. 9, 2012, all of which are hereby expressly incorporated by reference into the present application.

TECHNICAL FIELD

The embodiment relates to a light-emitting device, a method of manufacturing the same, a light-emitting device package, and a lighting system.

BACKGROUND ART

A light-emitting diode includes a P-N junction diode having a characteristic of converting electrical energy into light energy. The light-emitting device may include compound semiconductors belonging to group III and V on the periodic table. The light-emitting device can represent various colors by adjusting the compositional ratio of the compound semiconductors.

When forward voltage is applied to the light-emitting device, electrons of an N layer are combined with holes of a P layer, so that energy corresponding to an energy gap between a conduction band and a valance band may be generated. The energy is mainly emitted in the form of heat or light. In the case of the light-emitting device, the energy is generated in the form of light.

For example, a nitride semiconductor represents superior thermal stability and wide bandgap energy so that the nitride semiconductor has been spotlighted in the field of optical devices and high-power electronic devices. Specifically, blue light-emitting devices, green light-emitting devices, ultra-violet light-emitting devices, etc. using nitride semiconductors are commercialized and widely used.

Recently, as the demand for a high-efficiency light-emitting device is increased, the enhancement of light intensity has been issued.

In order to enhance the light, intensity, various attempts have been carried out to improve the structure of an active layer (MQW), an electron blocking layer (EBL), and a lower layer of the active layer, and good results are not obtained.

DISCLOSURE

Technical Problem

The embodiment relates to a light-emitting device, capable of enhancing light intensity, a method of manufacturing the same, a light-emitting device package, and a lighting system.

Technical Solution

A light-emitting device according to the embodiment may include: a first conductive semiconductor layer; a gallium nitride-based superlattice layer on the first conductive semiconductor layer; an active layer on the gallium nitride-based superlattice layer; a second conductive gallium nitride-based layer on the active layer; and a second conductive semiconductor layer on the second conductive gallium nitride-based layer, wherein the second conductive gallium nitride-based layer includes a second conductive GaN layer having a first concentration, a second conductive $In_xAl_yGa_{(1-x-y)}N$ (0<x<1, 0<y<1) layer having a second concentration and a second conductive $Al_zGa_{(1-z)}N$ (0<z<1) layer having a third concentration on the active layer.

Advantageous Effects

According to the embodiment, the light-emitting device having the optimal structure capable of enhancing the light intensity, the method of manufacturing the same, the light-emitting device package, and the lighting system can be provided.

BEST MODE

Mode for Invention

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

Embodiment

Figure 1:
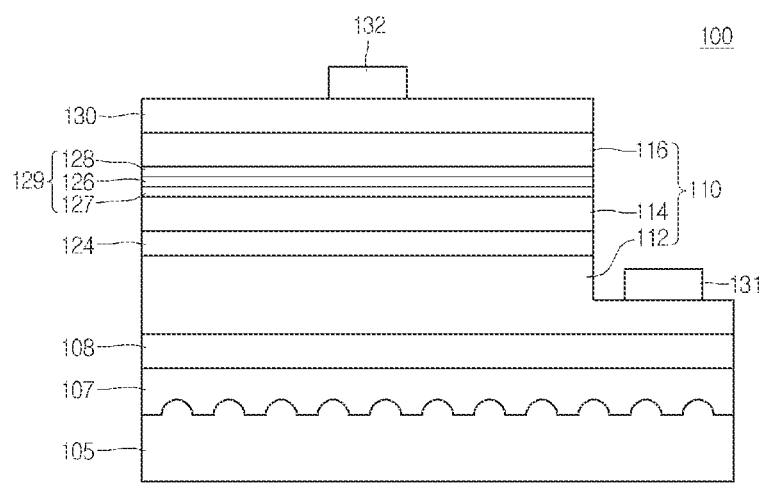
FIG. 1 is a sectional view showing a light-emitting device according to a first embodiment.
Figure 2:
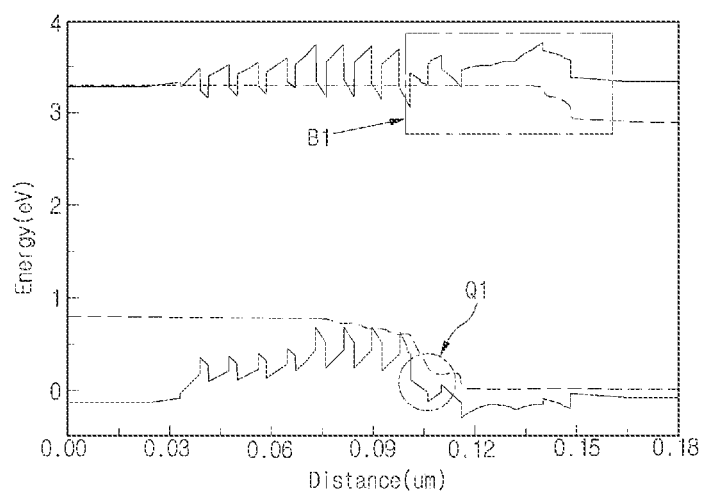
FIG. 2 is a view showing an example of an energy band diagram of the light-emitting device according to the first embodiment.
Figure 3:
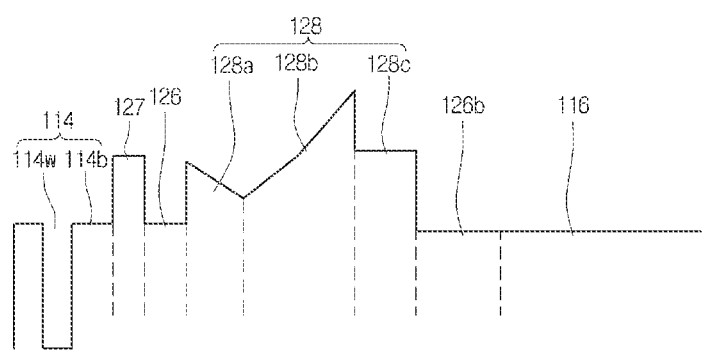
FIG. 3 is a partially enlarged energy band diagram of the light-emitting device according to the first embodiment.

FIG. 1 is a sectional view showing a light-emitting device 100 according to a first embodiment. FIG. 2 is a view showing an example of an energy band diagram of the light-emitting device 100 according to the first embodiment. FIG. 3 is a partially enlarged energy band diagram B1 of the light-emitting device according to the first embodiment.

The light-emitting device 100 according to the embodiment includes a first conductive semiconductor layer 112, a gallium nitride-based superlattice layer 124 on the first conductive semiconductor layer 112, an active layer 114 on the gallium nitride-based superlattice layer 124, a second conductive gallium nitride-based layer 129 on the active layer 114, and a second conductive semiconductor layer 116 on the second conductive gallium nitride-based layer 129.

According to the embodiment, a light-emitting device having the optimal structure capable of improving light intensity is provided.

According to nitride-based compounds of the related art, the mobility of electrons is greater than that of holes. Accordingly, electrons pass a multi-quantum well structure faster than holes to reach a P type nitride semiconductor layer. In other words, the electrons may flow into the P type nitride semiconductor layer without being recombined with the holes. To prevent the phenomenon and confine the electrons within the multi-quantum well structure, an AlGaN-based electron blocking layer (EBL) is generally used.

However, since the AlGaN-based electron blocking layer has higher energy bandgap, the AlGaN-based electron blocking layer interrupts holes introduced into the multi-quantum well structure to increase forward voltage.

In the light-emitting device 100 according to the embodiment, the second conductive gallium nitride-based layer 129 may include a second conductive GaN layer 126 having a first concentration on the active layer, a second conductive $In_xAl_yGa_{(1-x-y)}N$ (0<x<1, 0<y<1) layer 127 having a second concentration and a second conductive $Al_zGa_{(1-z)}N$ (0<z<1) layer 128 having a third concentration.

According to the embodiment, the lattice mismatch between the active layer 114 and the second conductive $Al_zGa_{(1-z)}N$ layer 128 having the third concentration may be reduced by the second conductive $In_xAl_yGa_{(1-x-y)}N$ layer 127 having the second concentration, and the thermal dissociation of the active layer 114 can be prevented. The second conductive $Al_zGa_{(1-z)}N$ layer 128 having the third concentration can more efficiently block electrons.

According to the first embodiment, the second conductive $In_xAl_yGa_{(1-x-y)}N$ layer 127 having the second concentration may be disposed closer to the active layer 114 than the second conductive $Al_zGa_{(1-z)}N$ layer 128 having the third concentration.

Therefore, in the light-emitting device 100 according to the first embodiment, the second conductive GaN layer 126 having the first concentration may be disposed between the second conductive $In_xAl_yGa_{(1-x-y)}N$ layer 127 having the second concentration and the second conductive $Al_zGa_{(1-z)}N$ layer 128 having the third concentration. In the embodiment, the first concentration is higher than the second concentration and the third concentration.

As described above, the second conductive GaN layer 126 having the first concentration is disposed between the second conductive $In_xAl_yGa_{(1-x-y)}N$ layer 127 having the second concentration and the second conductive $Al_zGa_{(1-z)}N$ layer 128 having the third concentration in such a manner that the first concentration is higher than the second concentration and the third concentration, thereby solving a problem that doping concentration may not be increased in the process of forming the first conductive semiconductor layer 112, the second conductive $In_xAl_yGa_{(1-x-y)}N$ layer 127 having the second concentration and the second conductive $Al_zGa_{(1-z)}N$ layer 128 having the third concentration.

In other words, in the second conductive $In_xAl_yGa_{(1-x-y)}N$ layer 127 having the second concentration and the second conductive $Al_zGa_{(1-z)}N$ layer 128 having the third concentration, as the composition of Al is increased, the bonding energy of AlN is increased so that the doping may be difficult. Therefore, the second conductive GaN layer 126 having the first concentration representing higher doping concentration is disposed between the second conductive $In_xAl_yGa_{(1-x-y)}N$ layer 127 having the second concentration and the second conductive $Al_zGa_{(1-z)}N$ layer 128 having the third concentration to enhance the light intensity and lower the operating voltage.

In addition, as compared with when only both of the second conductive $In_xAl_yGa_{(1-x-y)}N$ layer 127 having the second concentration and the second conductive $Al_zGa_{(1-z)}N$ layer 128 having the third concentration are used, when the second conductive GaN layer 126 having the first concentration is systematically bonded with the second conductive $In_xAl_yGa_{(1-x-y)}N$ layer 127 having the second concentration and the second conductive $Al_zGa_{(1-z)}N$ layer 128 having the third concentration, the second conductive GaN layer 126 having the first concentration representing higher doping concentration can more sufficiently provide holes to the active layer 114. Accordingly, the operating voltage of the light-emitting device is lowered, and an amount of heat emitted from the light-emitting device can be reduced.

The first embodiment, as shown in FIG. 3, may further include a secondary second conductive GaN layer 126b having the first concentration disposed between the second conductive $Al_zGa_{(1-z)}N$ layer 128 having the third concentration and the second conductive semiconductor layer 116.

According the embodiment, a thickness of the second conductive $Al_zGa_{(1-z)}N$ layer 128 having the third concentration may be between about 450 Å to 600 Å, but the embodiment is not limited thereto. When the thickness of the second conductive $Al_zGa_{(1-z)}N$ layer 128 having the third concentration is less than 450 Å, a leakage current may increase, and when the thickness exceeds 600 Å, electrons may not be adequately supplied to the active layer 114. A composition ratio of Al of the second conductive $Al_zGa_{(1-z)}N$ layer 128 having the third concentration may be between 15% to 2.0%, but the embodiment is not limited thereto. When the composition ratio of Al of the second conductive $Al_zGa_{(1-z)}N$ layer 128 having the third concentration is less than 15%, an optical efficiency is insufficiently improved, and when the composition ratio of Al of the second conductive $Al_zGa_{(1-z)}N$ layer 128 having the third concentration exceeds 20%, the surface becomes blunt and a crystallizability may decrease.

According to the embodiment, when the second conductive $Al_zGa_{(1-z)}N$ layer 128 having the third concentration has the thickness and the Al composition ratio, the supply of electrons to the active layer 114 increases and the leakage current reduces so the optical efficiency can be improved.

In the embodiment, the second conductive $Al_zGa_{(1-z)}N$ layer 128 having the third concentration may have an energy bandgap equal to or higher than an energy bandgap of a quantum wall 114b of the active layer and may include a primary second conductive $Al_zGa_{(1-z)}N$ layer 128a having the third concentration in which the energy bandgap is gradually decreased from the active layer 114 toward the second semiconductor layer 116 and a secondary second conductive $Al_zGa_{(1-z)}N$ layer 128b having the third concentration in which has an energy bandgap equal to or higher than the quantum wall 114b on the primary second conductive $Al_zGa_{(1-z)}N$ layer 128a having the third concentration and in which the energy bandgap is gradually increased.

In the embodiment, a width of the secondary second conductive $Al_zGa_{(1-z)}N$ layer 128b having the third concentration may be wider than a width of the primary second conductive $Al_zGa_{(1-z)}N$ layer 128a having the third concentration. The embodiment may further include, a tertiary second conductive $Al_zGa_{(1-z)}N$ layer 128c having the third concentration and in which a bandgap energy is constantly maintained on the secondary second conductive $Al_zGa_{(1-z)}N$ layer 128b having the third concentration.

According to the embodiment, a back diffusion of Mg to the active layer can be reduced by the primary second conductive $Al_zGa_{(1-z)}N$ layer 128a having the third concentration and in which the energy bandgap is gradually decreased, and an electron blocking is effectively performed to improve an optical extraction efficiency by the high Al composition of the secondary second conductive $Al_zGa_{(1-z)}N$ layer 128b having the third concentration.

Figure 4:
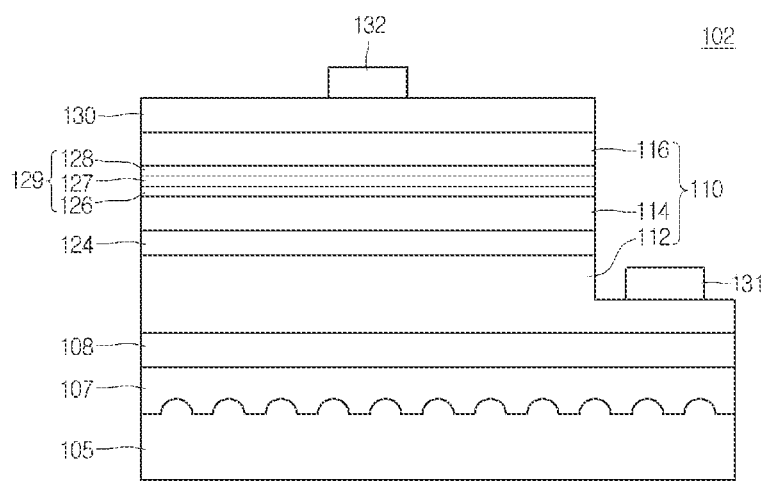
FIG. 4 is a sectional view showing a light-emitting device according to a second embodiment.
Figure 5:
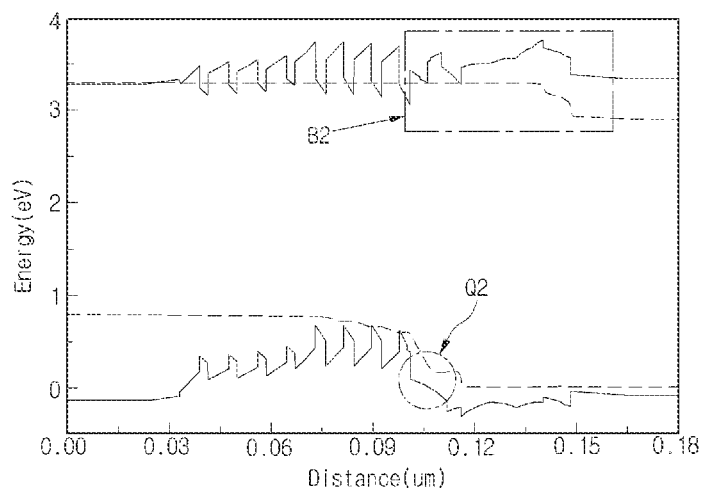
FIG. 5 is a view showing an example of an energy band diagram of the light-emitting device according to the second embodiment.
Figure 6:
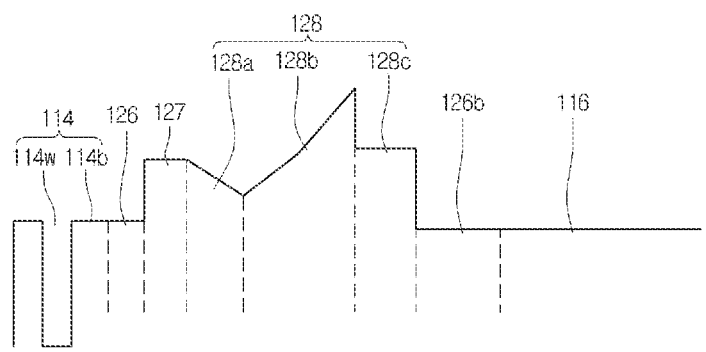
FIG. 6 is a partially enlarged energy band diagram of the light-emitting device according to the second embodiment.

FIG. 4 is a sectional view showing a light-emitting device 102 according to a second embodiment, FIG. 5 is a view showing an example of the energy-band diagram of the light-emitting device according to the second embodiment, and FIG. 6 is a view showing a partially enlarged energy band diagram B2 of the light-emitting device according to the second embodiment.

The first embodiment has the described effects, however, as shown in FIG. 2, when the second conductive GaN layer 126 having the first concentration is disposed between the second conductive $In_xAl_yGa_{(1-x-y)}N$ layer 127 having the second concentration and the second conductive $Al_zGa_{(1-z)}N$ having the third concentration, a hole transport obstacle region Q1 may occur.

To solve the problem, in the light-emitting device according to the second embodiment, the second conductive $In_xAl_yGa_{(1-x-y)}N$ layer 127 having the second concentration may be disposed between the second conductive GaN layer 126 having the first concentration and the second conductive $Al_zGa_{(1-z)}N$ layer 128 having the third concentration.

Accordingly, compared to FIG. 2 in which the hole transport obstacle region Q1 occurs, in FIG. 5, the hole transport can be adequately performed (Refer to Q2).

Figure 7:
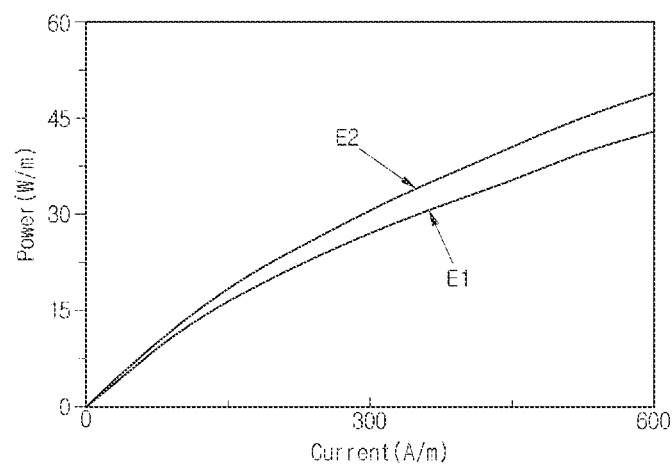
FIG. 7 is a view showing a comparison of a luminous intensity of the light-emitting device according to the first embodiment and the second embodiment.

FIG. 7 is a view showing a comparison of a luminous intensity of the light-emitting device according to the first embodiment and the second embodiment.

According to the second embodiment, when the second conductive $In_xAl_yGa_{(1-x-y)}N$ layer 127 having the second concentration is disposed between the second conductive GaN layer 126 having the first concentration and the second conductive $Al_zGa_{(1-z)}N$ layer 128 having the third concentration, a transfer efficiency of a carrier (hole) is improved, as shown in FIG. 7, so the intensity of light E2 in the second embodiment is improved compared to the intensity of light E1 in the embodiment 1.

Figure 8:
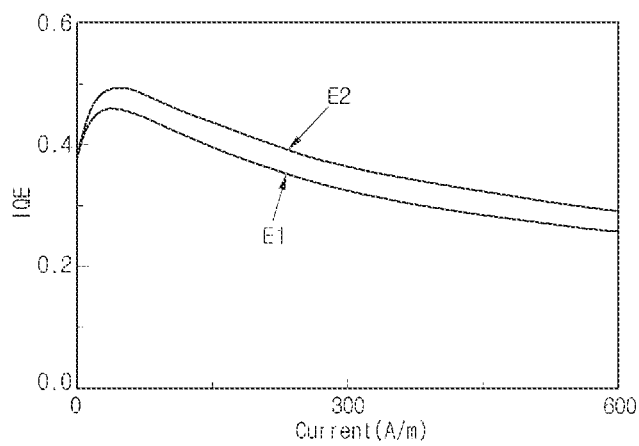
FIG. 8 is a view showing a comparison of an inner quantum efficiency of the light-emitting device according to the first embodiment and the second embodiment.

In addition, according to the second embodiment, when the second conductive $In_xAl_yGa_{(1-x-y)}N$ layer 127 having the second concentration is disposed between the second conductive GaN layer 126 having the first concentration and the second conductive $Al_zGa_{(1-z)}N$ layer 128 having the third concentration, the transfer efficiency of a carrier (hole) is improved, so the intensity of light of the light-emitting chip according to the second embodiment may be improved compared to the intensity of light of the light-emitting according to the first embodiment. FIG. 8 is a view showing a comparison of an inner quantum efficiency of the light-emitting device according to the first embodiment and the second embodiment.

Figure 9:
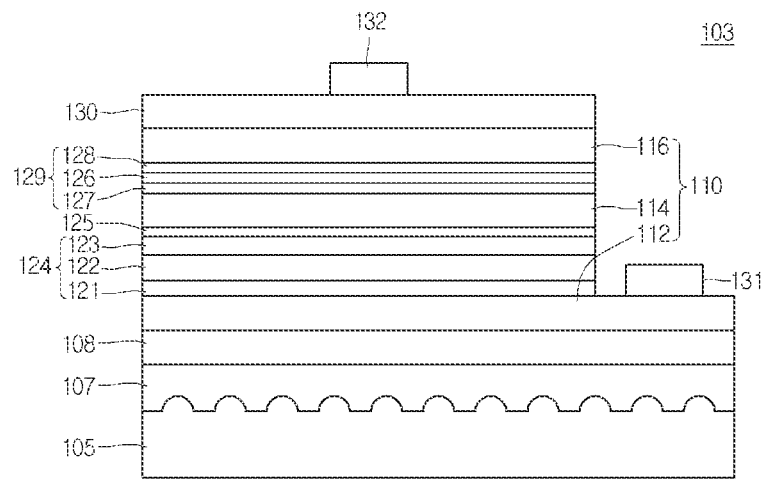
FIG. 9 is a sectional view of a light-emitting device according to a third embodiment.
Figure 10:
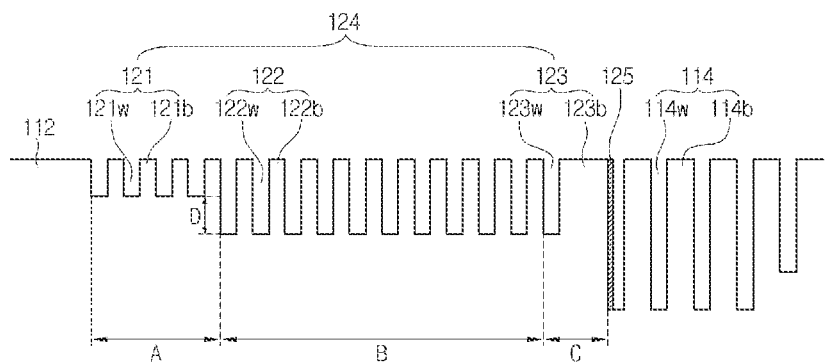
FIG. 10 is a view showing an example of an energy band diagram of the light-emitting device according to the third embodiment.

According to the second embodiment, when the second conductive $In_xAl_yGa_{(1-x-y)}N$ layer 127 having the second concentration is disposed between the second conductive GaN layer 126 having the first concentration and the second conductive $Al_zGa_{(1-z)}N$ layer 128 having the third concentration, the transfer efficiency of a carrier (hole) is improved, as shown in FIG. 8, so the inner quantum efficiency E2 of the light-emitting device according to the second embodiment is improved compared to the inner quantum efficiency E1 of the light-emitting device according to the first embodiment FIG. 9 is a sectional view of a light-emitting device 103 according to a third embodiment. FIG. 10 is a view showing an example of an energy band diagram of the light-emitting device according to the third embodiment.

According to the third embodiment, the gallium nitride-based superlattice layer 124 may have a bandgap energy level which varies from the first conductive semiconductor layer 112 toward the active layer 114.

For example, the bandgap energy level of the gallium nitride-based superlattice layer 124 may be reduced in the form of a step from the first conductive semiconductor layer 112 toward the active layer 114, but the embodiment is not limited thereto.

For example, the gallium nitride-based superlattice layer 124 may include a first-group gallium nitride-based superlattice layer 121 having first bandgap energy at an area A adjacent to the first conductive semiconductor layer 112 and a second-group gallium nitride-based superlattice layer 122 having second bandgap energy lower than the first bandgap energy on the first-group gallium nitride-based superlattice layer 121 (area B).

In addition, the gallium nitride-based superlattice layer 124 may further include a third-group gallium nitride-based superlattice layer 123 having third bandgap energy provided on the second-group gallium nitride-based superlattice layer 122 at an area C adjacent to the active layer 114.

The third bandgap energy may be equal to or lower than the second bandgap energy, but the embodiment is not limited thereto.

In this case, the first-group gallium nitride-based superlattice layer 121 may include a first-group well 121w and a first-group barrier 121b, the second-group gallium nitride-based superlattice layer 122 may include a second-group well 122w and a second-group barrier 122b, and the third-group gallium nitride-based superlattice layer 123 may include a third-group well 123w and the third-group barrier 123b.

The gallium nitride-based superlattice layer 124 may include an $In_xGa_{1-x}N/GaN$ (0<x<1) superlattice layer, and the difference D between a first bandgap energy level and a second bandgap energy level may be equal to or higher than a photon energy level of the gallium nitride-based superlattice layer.

For example, only when the difference (energy difference) of a well depth in the gallium nitride-based superlattice layer belonging to each group is equal to or higher than the phonon energy (about 88 meV) of InGaN, a portion of the energy of hot electrons may be transferred in the form of the phonon energy.

The gallium nitride-based superlattice layer 124 according to the embodiment may have at least two energy steps and the depth of a quantum well (multi-quantum well) 114w of the active layer 114 is about 200 meV, so a plurality of energy steps can be provided and the number of the energy steps may be determined by dividing the depth of the quantum well by the minimum phonon energy.

According to the embodiment, the energy level of each group may be adjusted by adjusting the concentration of In contained in the well of each group.

For example, the concentration of In contained in the second-group gallium nitride-based superlattice layer 122 may be set to a value higher than that of In contained in the first-group gallium nitride-based superlattice layer 121, thereby reducing the energy level of the second-group well 122w to lower than the energy level of the first-group well 121w.

According to the embodiment, hot electrons are cooled by the gallium nitride-based superlattice layer having a plurality of energy steps, so that a high-power light-emitting device having an effective electron injection layer can be provided.

According to the embodiment, the thickness of each group of the GaN-based superlattice layer may be controlled in order to enhance the electron injection efficiency by more efficiently cooling the hot electrons.

For example, the thickness of the first-group gallium nitride-based superlattice layer 121 may be thinner than the thickness of the second-group gallium nitride-based super lattice layer 122.

In this case, the thickness of the first-group well 121w provided in the first-group gallium nitride-based superlattice layer 121 may be equal to the thickness of the first-group barrier 121b provided in the first-group gallium nitride-based superlattice layer 121 and the first-group well 121w and the first-group barrier 121b may be prepared in a plurality of cycles. For example, the first-group well 121w and the first-group barrier 121b may be controlled to have an equal thickness in the range of about 1 nm to 3 nm and may be prepared in a plurality of cycles so that the hot carriers can be effectively cooled as compared with a case where a single thick well and a single thick barrier are provided.

In addition, the second-group well 122w and the second-group barrier 122b provided in the second-group gallium nitride-based superlattice layer 122 may be controlled to have an equal same thickness in the range of about 1 nm to 3 nm and may be prepared in a plurality of cycles so that the cooling of the hot carriers can be induced as compared with a case where a single thick well and a single thick barrier are provided.

In this case, the thickness of the second-group well 122w may be equal to the thickness of the first-group well 121w and the thickness of the second-group barrier 122b may be equal to the thickness of the first-group barrier 121b. Thus, even if the carriers recognize a predetermined energy barrier in the gallium nitride-based superlattice layer, the carriers may not be extinguished within the gallium nitride-based superlattice layer due to the well and the barrier having the regular thickness, so that the carriers can be smoothly injected.

According to the embodiment, the total thickness of the second-group gallium nitride-based superlattice layer 122 may be thicker than the total thickness of the first-group gallium nitride-based superlattice layer 121. For example, the second-group gallium nitride-based superlattice layer 122 may include the second-group well 122w and the second-group barrier 122b repeatedly formed in about 8 to 12 cycles and the first-group gallium nitride-based superlattice layer 121 may include the first-group well 121w and the first-group barrier 121b repeatedly formed in about 3 to 5 cycles.

According to the embodiment, the hot carriers can be stably cooled for longer time in the second-group gallium nitride-based superlattice layer 122 that meets partially-cooled hot carriers rather than the first-group gallium nitride-based superlattice layer 121 that primarily meets the hot carriers, so the hot carriers may be efficiently cooled, thereby preventing the hot carriers from being overflowed.

In addition, according to the embodiment, the thickness of the third-group well 123w in the third-group gallium nitride-based superlattice layer 123 may be equal to the thickness of the second-group well 122w and thinner than the thickness of the third-group barrier 123b.

For example, the thickness of the third-group well 123w may be in the range of about 1 nm to about 3 nm, and the thickness of the third-group barrier 123b may be in the range of about 7 nm to about 11 nm, but the embodiment is not limited thereto.

According to the embodiment, the third-group barrier 123b may be adjacent to the active layer 114, and the thickness of the third-group barrier 123b, which is the final barrier, may be thicker than that of the barriers and wells of other groups.

According to the embodiment, the third-group barrier 123b may be doped with a first conductive element to improve the electron injection efficiency.

In addition, according to the embodiment, an undoped GaN layer 125 is further disposed between the third-group barrier 123b and the quantum well 114w of the active layer 114 to prevent the first conductive element doped in the third-group barrier 123b from diffusing into the active layer 114 and blocking the recombination for light emission.

According to the embodiment, hot electrons are cooled by the gallium nitride-based superlattice layer having a plurality of energy steps, so that a high-power light-emitting device having an effective electron injection layer can be provided.

Figure 11:
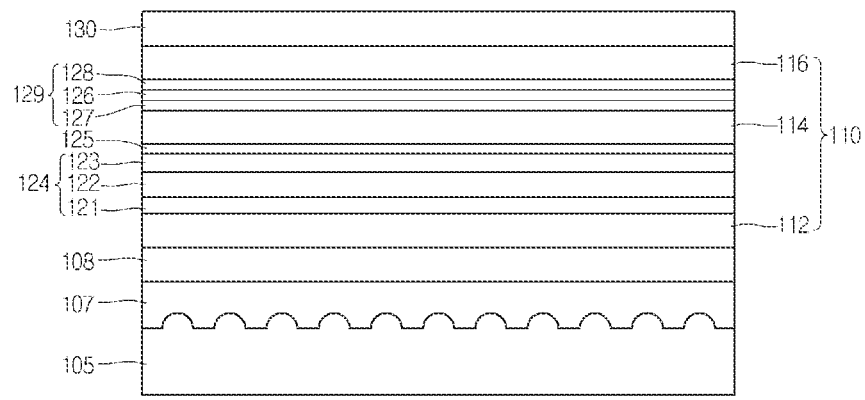
FIG. 11 to 12 are sectional views of a process of a method of manufacturing a light-emitting device according the embodiment.
Figure 12:
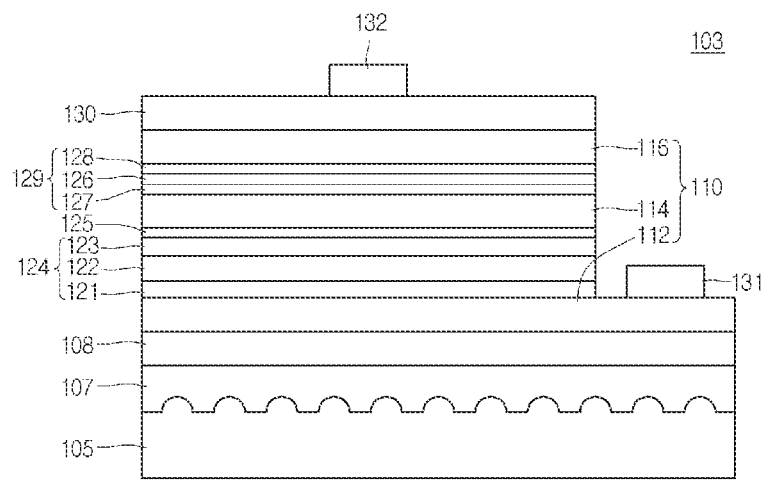

A method of manufacturing the light-emitting device according the embodiment is described with reference to FIG. 11 and FIG. 12. FIG. 11 and FIG. 12 describes the manufacturing method based on the third embodiment, however, the embodiment is not limited thereto.

Meanwhile, FIG. 12 shows a lateral type light-emitting device, in which the light-emitting device 103 according to the third embodiment is grown on a predetermined growth substrate 105, however the embodiment is not limited thereto, and may be employed in a vertical light-emitting device, in which an electrode is formed on a first conductive semiconductor layer exposed after the growth substrate is removed.

First, as shown in FIG. 11, in the light-emitting device according to the embodiment, a substrate 105 may include a material having excellent thermal conductivity, and may include a conductive substrate or an insulating substrate. For example, the substrate 105 may include at least one of sapphire ($Al_2O_3$), SiC, Si, GaAs, GaN, ZnO, GaP, InP, Ge, and $Ga_2O_3$.

According to the embodiment, a light reflection pattern is provided to enhance light extraction efficiency. For example, a patterned sapphire substrate (PSS) may be formed on the substrate 105 to enhance the light extraction efficiency.

In addition, according to the embodiment, a buffer layer 107 and an undoped semiconductor layer 108 are formed on the substrate 105 to reduce the lattice mismatch between a material of the light-emitting structure 110 and a material of the substrate 105. For example, the buffer layer 107 may be formed of group III-V compound semiconductors, for example at least one of GaN, InN, AlN, InGaN, AlGaN, InAlGaN, and AlInN, but the embodiment is not limited thereto.

Then, a first conductive semiconductor layer 112 is formed on the undoped semiconductor layer 108. For example, the first conductive semiconductor layer 112 may include a semiconductor material having a compositional formula of $InAl_yGa_{1-x-y}N$ (0≤x≤1, 0≤y≤1, 0≤x+y≤1). In detail, the first conductive semiconductor layer 112 may include at least one of GaN, InN, AlN, InGaN, AlGaM, InAlGaM, AlInN, AlGaAs, InGaAs, AlInGaAs, GaP, AlGaP, InGaP, AlInGaP, and InP, but the embodiment is not limited thereto.

Next, the gallium nitride-based superlattice layer 124 may be formed on the first conductive semiconductor layer 112. The gallium nitride-based superlattice layer 124 may effectively reduce the stress caused by lattice mismatch between the first conductive semiconductor layer 112 and the active layer 114.

According to the embodiment, in an epi end, a light-emitting device having the optimal structure capable of improving light intensity is provided.

To this end, as shown in FIG. 10, in the embodiment, the gallium nitride-based superlattice layer 124 may have a bandgap energy level which varies from the first conductive semiconductor layer 112 toward the active layer 114.

For example, the gallium nitride-based superlattice layer 124 may include a first-group gallium nitride-based superlattice layer 121 having first bandgap energy and a second-group gallium nitride-based superlattice layer 122 having second bandgap energy lower than the first bandgap energy on the first-group gallium nitride-based superlattice layer 121.

In addition, the gallium nitride-based superlattice layer 124 may further include a third-group gallium nitride-based superlattice layer 123 having the third bandgap energy disposed on the second-group gallium nitride-based superlattice layer 122.

In this case, the first-group gallium nitride-based superlattice layer 121 may include a first-group well 121w and a first-group barrier 121b, the second-group gallium nitride-based superlattice layer 122 may include a second-group well 122w and a second-group barrier 122b, and the third-group gallium nitride-based superlattice layer 123 may include a third-group well 123w and the third-group barrier 123b.

The gallium nitride-based superlattice layer 124 may include an $In_xGa_{1-x}N/GaN$ (0<x<1) superlattice layer, and the difference D between a first bandgap energy level and a second bandgap energy level may be equal to or higher than a photon energy level of the gallium nitride-based superlattice layer.

According to the embodiment, a growth temperature of a second group well 122w of the second-group gallium nitride-based superlattice layer 122 may be higher than a growth temperature of a first-group well 121w of the first-group gallium nitride-based superlattice layer 121. For example, the first-group well 121w may be performed at a temperature equal to or lower than 500° C., and the second-group well (122w) may be grown at a temperature equal to or higher than about 900° C.

An entire growth temperature of the gallium nitride-based superlattice layer 124 may be performed at a temperature equal to or higher than 800° C.

According to the embodiment, an amount of indium (In) in each group well of the gallium nitride-based superlattice layer 124 may be controlled by controlling the growth temperature through a photo luminescence sub-peak position, but the embodiment is not limited thereto.

According to the embodiment, the energy level of each group may be adjusted by adjusting the concentration of In contained in the well of each group. For example, the concentration of In contained in the second-group gallium nitride-based superlattice layer 122 may be set to a value higher than that of In contained in the first-group gallium nitride-based superlattice layer 121, thereby reducing the energy level of the second-group well 122w to lower than the energy level of the first-group well 121w.

According to the embodiment, hot electrons are cooled by the gallium nitride-based superlattice layer having a plurality of energy steps, so that a high-power light-emitting device having an effective electron injection layer can be provided.

In addition, according to the embodiment, the thickness of each group of the GaN-based superlattice layer may be controlled in order to enhance the electron injection efficiency by more efficiently cooling the hot electrons.

For example, the thickness of the first-group gallium nitride-based superlattice layer 121 may be thinner than the thickness of the second-group gallium nitride-based super lattice layer 122.

In this case, the thickness of the first-group well 121w provided in the first-group gallium nitride-based superlattice layer 121 may be equal to the thickness of the first-group barrier 121b provided in the first-group gallium nitride-based superlattice layer 121 and the first-group well 121w and the first-group barrier 121b may be prepared in a plurality of cycles. For example, the first-group well 121w and the first-group barrier 121b may be controlled to have an equal thickness in the range of about 1 nm to 3 nm and may be prepared in a plurality of cycles so that the hot carriers can be effectively cooled as compared with a case where a single thick well and a single thick barrier are provided.

In addition, the second-group well 122w and the second-group barrier 122b provided in the second-group gallium nitride-based superlattice layer 122 may be controlled to have an equal same thickness in the range of about 1 nm to 3 nm and may be prepared in a plurality of cycles so that the cooling of the hot carriers can be induced as compared with a case where a single thick well and a single thick barrier are provided.

In this case, the thickness of the second-group well 122w may be equal to the thickness of the first-group well 121w and the thickness of the second-group barrier 122b may be equal to the thickness of the first-group barrier 121b. Thus, even if the carriers recognize a predetermined energy barrier in the gallium nitride-based superlattice layer, the carriers may not be extinguished within the gallium nitride-based superlattice layer due to the well and the barrier having the regular thickness, so that the carriers can be smoothly injected.

According to the embodiment, the total thickness of the second-group gallium nitride-based superlattice layer 122 may be thicker than the total thickness of the first-group gallium nitride-based superlattice layer 121.

According to the embodiment, the hot carriers can be stably cooled for longer time in the second-group gallium nitride-based superlattice layer 122 that meets partially-cooled hot carriers rather than the first-group gallium nitride-based superlattice layer 121 that primarily meets the hot carriers, so the hot carriers may be efficiently-cooled, thereby preventing the hot carriers from being overflowed.

In addition, according to the embodiment, the thickness of the third-group well 123w in the third-group gallium nitride-based superlattice layer 123 may be equal to the thickness of the second-group well 122w and thinner than the thickness of the third-group barrier 123b.

According to the embodiment, the third-group barrier 123b may be adjacent to the active layer 114, and the thickness of the third-group barrier 123b, which is the final barrier, may be thicker than that of the barriers and wells of other groups.

According to the embodiment, the third-group barrier 123b may be doped with a first conductive element to improve the electron injection efficiency. According to the embodiment, the third-group barrier 123b may be doped with high Si to improve the electron injection efficiency. For example, the third-group barrier 123b may be doped by Si equal to or higher than 19 cc, but the embodiment is not limited thereto.

In addition, according to the embodiment, an undoped GaN layer 125 is further disposed between the third-group barrier 123b and the quantum well 114w of the active layer 114 to prevent the first conductive element doped in the third-group barrier 123b from diffusing into the active layer 114 and blocking the recombination for light emission.

According to the embodiment, hot electrons are cooled by the gallium nitride-based superlattice layer having a plurality of energy steps, so that a high-power light-emitting device having an effective electron injection layer can be provided.

Then, the active layer 114 is formed on the gallium nitride-based superlattice layer 124.

According to the embodiment, the active layer 114 may include at least one of a single quantum well structure, a multi quantum well (MQW) structure, a quantum wire structure, and a quantum dot structure.

For example, the active layer 114 may include the multi quantum well structure by injecting trimethylgallium gas (TMGa), ammonia gas ($NH_3$), nitrogen gas ($N_2$), and trimethylindium gas (TMIn), however, the embodiment is not limited thereto.

The well layer 114w/barrier layer 114b of the active layer 114 may include at least one of InGaN/InGaN, GaN/AlGaN, InAlGaN/GaN, GaAs(InGaAs)/AlGaAs, GaP(InGaP)/AlGaP pair structures, but the embodiment is not limited thereto. The well layer may be formed of material having a bandgap lower than a bandgap of the barrier layer.

The barrier layer 114b may be grown at a pressure of about 150 torr to 250 torr, and a temperature of about 700° C. to 800° C., however, the embodiment is not limited thereto.

Thereafter, in the embodiment, the second conductive gallium nitride-based layer 129 is formed on the active layer 114.

According to the embodiment, a light-emitting device having the optimal structure capable of improving light intensity is provided.

According to the embodiment, the second conductive gallium nitride-based layer 129 may include, on the active layer 114, the second conductive GaN layer 126 having the first concentration, the second conductive $In_xAl_yGa_{(1-x-y)}N$ (0<x<1, 0<y<1) layer 127 having the second concentration and the second conductive $Al_zGa_{(1-z)}N$ (0<z<1) layer 128 having the third concentration.

According to the embodiment, the lattice mismatch between the active layer 114 and the second conductive $Al_zGa_{(1-x-y)}N$ layer 128 having the third concentration may be reduced by the second conductive $In_xAl_yGa_{(1-x-y)}N$ layer 127 having the second concentration, and the thermal dissociation of the active layer 114 can be prevented. The second conductive $Al_zGa_{(1-z)}N$ layer 128 having the third concentration can more efficiently block electrons.

According to the first embodiment, the second conductive $In_xAl_yGa_{(1-x-y)}N$ layer 127 having the second concentration may be disposed closer to the active layer 114 than the second conductive $Al_zGa_{(1-z)}N$ layer 128 having the third concentration.

In the light-emitting device according to the first embodiment, the second conductive GaN layer 126 having the first concentration may be disposed between the second conductive $In_xAl_yGa_{(1-x-y)}N$ layer 127 having the second concentration and the second conductive $Al_zGa_{(1-z)}N$ layer 128 having the third concentration. According to the embodiment, the first concentration is higher than the second concentration and the third concentration.

As described above, the second conductive GaN layer 126 having the first concentration is disposed between the second conductive $In_xAl_yGa_{(1-x-y)}N$ layer 127 having the second concentration and the second conductive $Al_zGa_{(1-z)}N$ layer 128 having the third concentration in such a manner that the first concentration is higher than the second concentration and the third concentration, thereby solving a problem that doping concentration may not be increased in the process of forming the first conductive semiconductor layer 112, the second conductive $In_xAl_yGa_{(1-x-y)}N$ layer 127 having the second concentration and the second conductive $Al_zGa_{(1-z)}N$ layer 128 having the third concentration.

In other words, in the second conductive $In_xAl_yGa_{(1-x-y)}N$ layer 127 having the second concentration and the second conductive $Al_zGa_{(1-z)}N$ layer 128 having the third concentration, as the composition of Al is increased, the bonding energy of AlN is increased so that the doping may be difficult. Therefore, the second conductive GaN layer 126 having the first concentration representing higher doping concentration is disposed between the second conductive $In_xAl_yGa_{(1-x-y)}N$ layer 127 having the second concentration and the second conductive $Al_zGa_{(1-z)}N$ layer 128 having the third concentration to enhance the light intensity and lower the operating voltage.

In addition, as compared with when only both of the second conductive $In_xAl_yGa_{(1-x-y)}N$ layer 127 having the second concentration and the second conductive $Al_zGa_{(1-z)}N$ layer 128 having the third concentration are used, when the second conductive GaN layer 126 having the first concentration is systematically bonded with the second conductive $In_xAl_yGa_{(1-x-y)}N$ layer 127 having the second concentration and the second conductive $Al_zGa_{(1-z)}N$ layer 128 having the third concentration, the second conductive GaN layer 126 having the first concentration representing higher doping concentration can more sufficiently provide holes to the active layer 114. Accordingly, the operating voltage of the light-emitting device is lowered, and an amount of heat emitted from the light-emitting device can be reduced.

The first embodiment, as shown in FIG. 3, may further include a secondary second conductive GaN layer 126b of the first concentration disposed between the second conductive $Al_zGa_{(1-z)}N$ layer 128 having the third concentration and the second conductive semiconductor layer 116.

In the embodiment, a thickness of the second conductive $Al_zGa_{(1-z)}N$ layer 128 having the third concentration may be between about 450 Å to 600 Å, but the embodiment is not limited thereto.

A composition ratio of Al of the second conductive $Al_zGa_{(1-z)}N$ layer 128 having the third concentration may be between 15% to 20%, but the embodiment is not limited thereto. When the composition ratio of Al of the second $Al_zGa_{(1-z)}N$ layer 128 having the third concentration is less than 15%, an optical efficiency is insufficiently-improved, and when the composition ratio of Al of the second conductive $Al_zGa_{(1-z)}N$ layer 128 having the third concentration exceeds 20%, the surface becomes blunt and a crystallizability may decrease.

According to the embodiment, when the second conductive $Al_zGa_{(1-z)}N$ layer 128 having the third concentration has the thickness and the Al composition ratio, the supply of electrons to the active layer 114 increases and the leakage current reduces so the optical efficiency can be improved.

In the embodiment, the second conductive $Al_zGa_{(1-z)}N$ layer 128 layer having the third concentration may have an energy band gap equal to or higher than an energy bandgap of a quantum wall 114b of the active layer and may include a primary second conductive $Al_zGa_{(1-z)}N$ layer 128a having the third concentration in which the energy bandgap is gradually decreased from the active layer 114 toward the second semiconductor layer 116 and a secondary second conductive $Al_zGa_{(1-z)}N$ layer 128b having the third concentration in which has an energy bandgap equal to or higher than the quantum wall 114b on the primary second conductive $Al_zGa_{(1-z)}N$ layer 128a having the third concentration and in which the energy bandgap is gradually increased.

In the embodiment, a width of the secondary second conductive $Al_zGa_{(1-z)}N$ layer 128b having the third concentration may be wider than a width of the primary second conductive $Al_zGa_{(1-z)}N$ layer 128a having the third concentration. The embodiment may further include, a tertiary second conductive $Al_zGa_{(1-z)}N$ layer 128c having the third concentration and in which a bandgap energy is constantly maintained on the secondary second conductive $Al_zGa_{(1-z)}N$ layer 128b having the third concentration.

According to the embodiment, a back diffusion of Mg to the active layer can be reduced by the primary second conductive $Al_zGa_{(1-z)}N$ layer 128 having the third concentration and in which the energy bandgap is gradually decreased, and an electron blocking is effectively performed to improve an optical extraction efficiency by the high Al composition of the secondary second conductive $Al_zGa_{(1-z)}N$ layer 128 having the third concentration.

In the light-emitting device according to the second embodiment, the second conductive $In_xAl_yGa_{(1-x-y)}N$ layer 127 having the second concentration may be disposed between the second conductive GaN layer 126 having the first concentration and the second conductive $Al_zGa_{(1-z)}N$ layer 128 having the third concentration.

In the light-emitting device according to the second embodiment, the second conductive $In_xAl_yGa_{(1-x-y)}N$ layer 127 having the second concentration may be disposed between the second conductive GaN layer 126 having the first concentration and the second conductive $Al_zGa_{(1-z)}N$ layer 128 having the third concentration.

Accordingly, compared to FIG. 2 in which the hole transport obstacle region Q1 occurs, in FIG. 5, the hole transport can be adequately performed (Refer to Q2).

According to the embodiment, the second conductive GaN layer 126 having the first concentration may be grown at a pressure of about 50 torr to 150 torr, and a temperature of about 850° C. to 940° C., but the embodiment is not limited thereto.

The second conductive $In_xAl_yGa_{(1-x-y)}N$ layer 127 may be grown at a pressure of about 150 torr to 250 torr, and a temperature of about 850° C. to 940° C., but the embodiment is not limited thereto.

The second conductive $In_xAl_yGa_{(1-x-y)}N$ layer 127 may have a composition ratio of Al in a range of about 7%~11% and In in a range of about 1%~4%, but the embodiment is not limited thereto.

Thereafter, the second conductive semiconductor layer 116 is formed on the second conductive gallium nitride-based layer 129.

The second conductive semiconductor layer 116 may include a semiconductor compound. The second conductive semiconductor layer 116 may be realized by using groups III-V-II-VI compound semiconductors, and may be doped with second conductive type dopants.

For example, the second conductive semiconductor layer 116 may include a semiconductor material having a compositional formula of $In_xAl_yGa_{1-x-y}N$ (0≤x≤1, 0≤y≤1, and 0≤x+y≤1). If the second conductive semiconductor layer 116 is a P type semiconductor layer, the second conductive dopant, which serves as a P type dopant, may include Mg, Zn, Ca, Sr, or Ba.

Thereafter, the second conductive semiconductor layer 116 may be provided thereon with a transmissive electrode 130. The transmissive electrode 130 may include a transmissive ohmic layer, and may be formed by laminating single metal, or by laminating a metal alloy and metal oxide in a multi-layer such that carrier injection may be efficiently performed.

The transmissive electrode 130 may include at least one of ITO (indium tin oxide), IZO (indium zinc oxide), IZTO (indium zinc tin oxide), IAZQ (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO(In—Ga ZnO), ZnO, IrOx, RuOx, and NiO, but the embodiment is not limited thereto.

According to the embodiment, the first conductive semiconductor layer 112 may include an N type semiconductor layer and the second conductive semiconductor layer 116 may include a P type semiconductor layer, but the embodiment is not limited thereto. In addition, a semiconductor layer, such as an N type semiconductor layer (not illustrated) having polarity opposite to that of the second conductive semiconductor layer 116, may be formed on the second conductive semiconductor layer 116. Thus, the light-emitting structure 110 may include one of an N-P junction structure, a P-N junction structure, an N-P-N junction structure, and a P-N-P junction structure.

Subsequently, as shown in FIG. 12, portions of the transmissive electrode 130, the second conductive semiconductor layer 116, the second conductive gallium nitride-based layer 129, the active layer 114, and the gallium nitride-based superlattice layer 124 may be removed to expose the first conductive semiconductor layer 112.

Then, a second electrode 132 is formed on the transmissive electrode 130, and a first electrode 131 is formed on the first conductive semiconductor layer 112 that is exposed.

According to the embodiment, the light-emitting device having the optimal structure capable of enhancing the light intensity, the method of manufacturing the same, the light-emitting device package, and the lighting system can be provided.

Figure 13:
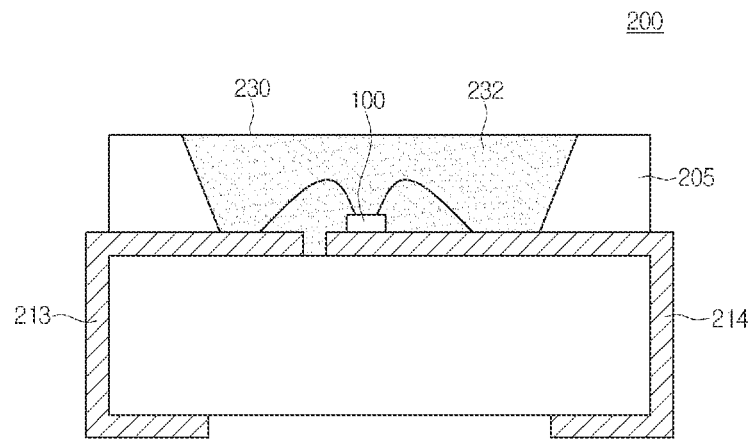
FIG. 13 is a sectional view showing a light-emitting device package having the light-emitting device according to the embodiment.

FIG. 13 is a sectional view showing a light-emitting device package 200 having the light-emitting device according to the embodiments.

The light-emitting device package 200 according to the embodiment includes a package body 205, third and fourth electrode layers 213 and 214 installed in the package body 205, a light-emitting device 100 installed in the package body 205 and electrically connected with the third and fourth electrode layers 213 and 214, and a molding member 230 to surround the light-emitting device 100.

The package body 205 may include a silicon material, a synthetic resin material, or a metallic material. The package body 205 may have an inclination surface formed at a peripheral portion of the light-emitting device 100.

The third and fourth electrode layers 213 and 214 are electrically isolated from each other and supply power to the light-emitting device 100. In addition, the third and fourth electrode layers 213 and 214 may reflect light emitted from the light-emitting device 100 to increase the light efficiency, and discharge the light emitted from the light-emitting device 100 to the outside.

The light-emitting device 100 may include a lateral-type light-emitting device shown in FIGS. 1, 4, and 9, but the embodiment is not limited thereto. In other words, the light-emitting device may include a vertical type light-emitting device, or a flip-chip light-emitting device.

The light-emitting device may be installed in the package body 205, or may be installed on the third electrode layer 213 or the fourth electrode layer 214.

The light-emitting device 100 may be electrically connected with the third electrode layer 213 and/or the fourth electrode layer 214 through one of a wire scheme, a flip-chip scheme, or a die-bonding scheme. According to the embodiment, the light-emitting device 100 is electrically connected with the third electrode layer 213 through a wire 230, and electrically connected with the fourth electrode layer 214 in the direct contact with the fourth electrode layer 214 for the illustrative purpose.

The molding member 230 may protect the light-emitting device 100 by surrounding the light-emitting device 100. In addition, a phosphor 232 is included in the molding member 230 to change the wavelength of the light emitted from the light-emitting device 100.

Light-emitting device packages according to the embodiment may be arrayed on a substrate, and a light guide plate, a prism sheet, a diffusion sheet, and a fluorescent sheet may be provided on the path of light emitted from the light-emitting device package. The light-emitting device package, the substrate, and the optical member may serve as a backlight unit or a lighting unit. For example, the lighting system may include a backlight unit, a lighting unit, an indication device, a lamp, and a street lamp.

Figure 14:
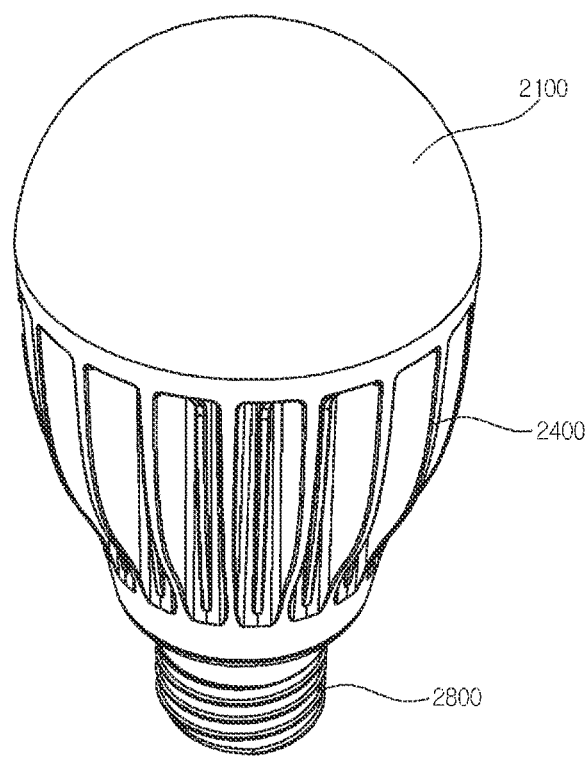
FIGS. 14 to 16 are views showing a lighting device according to the embodiment.
Figure 15:
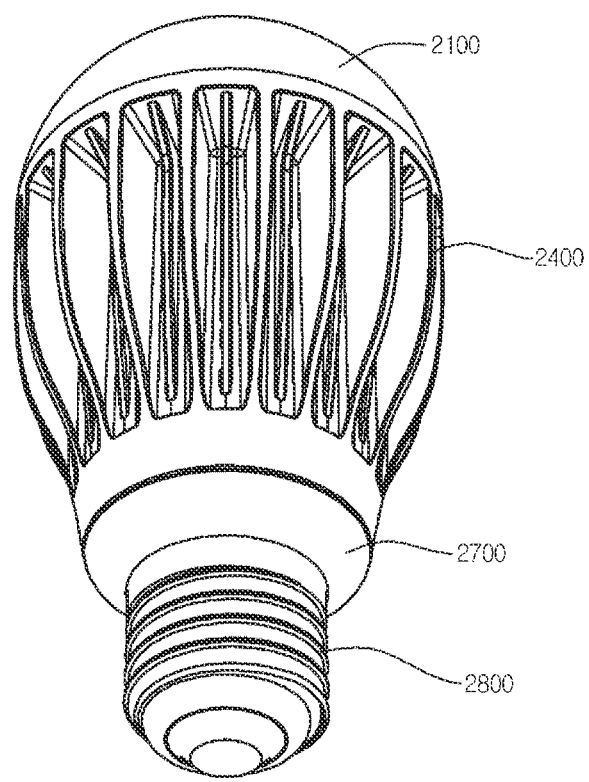
Figure 16:
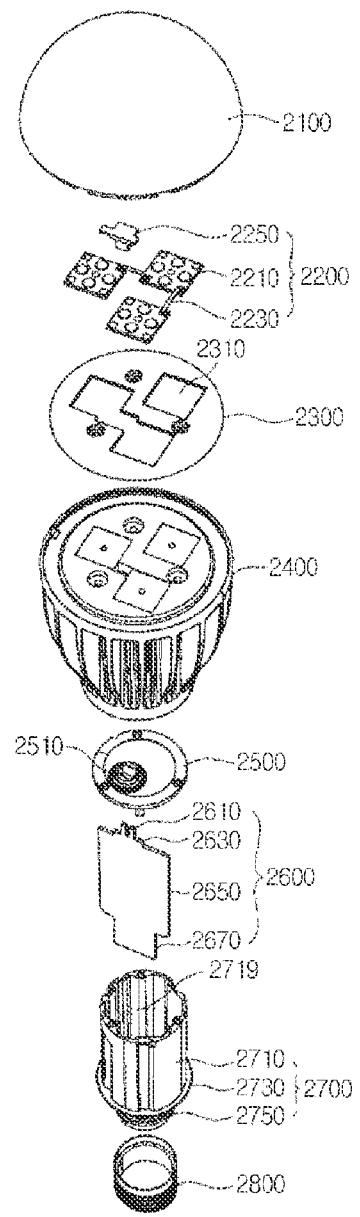

FIGS. 14 to 16 are views showing a lighting device including the light-emitting device according to the embodiment.

FIG. 14 is a perspective view showing the lighting device according to the embodiment when viewed from the top of the lighting device. FIG. 15 is a perspective view showing the lighting device according to the embodiment when viewed from the bottom of the lighting device. FIG. 16 is an exploded perspective view showing the lighting device of FIG. 14.

Referring to FIGS. 14 to 16, the lighting device according to the embodiment may include a cover 2100, a light source module 2200, a radiator 2400, a power supply part 2600, an inner case 2700, and a socket 2800. In addition, the lighting device according to the embodiment may further include at least one of a member 2300 and a holder 2500. The light source module 2200 may include the light-emitting device 100 or the light-emitting device package according to the embodiment.

For example, the cover 2100 may have a blub shape, a hemisphere shape, a partially-open hollow shape. The cover 2100 may be optically coupled to the light source module 2200. For example, the cover 2100 may diffuse, scatter, or excite light provided from the light source module. The cover 2100 may be a type of optical member. The cover 2100 may be coupled to the radiator 2400. The cover 2100 may include a coupling part which is coupled to the radiator 2400.

The cover 2100 may include an inner surface coated with a milk-white paint. The milk-white paint may include a diffusion material to diffuse light. The cover 2100 may have the inner surface of which surface roughness is greater than that of the outer surface thereof. The surface roughness is provided for the purpose of sufficiently scattering and diffusing the light from the light source module 2200.

A material of the cover 2100 may include glass, plastic, polypropylene (PP), polyethylene (PE), and polycarbonate (PC). The polycarbonate (PC) has the superior light resistance, heat resistance and strength among the above materials. The cover 2100 may be transparent so that a user may view the light source module 2200 from the outside, or opaque. The cover 2100 may be formed through a blow molding scheme.

The light source module 2200 may be disposed at one surface of the radiator 2400. Accordingly, the heat from the light source module 2200 is transferred to the radiator 2400. The light source module 2200 may include a light source 2210, a connection plate 2230, and a connector 2250.

The member 2300 is disposed at a top surface of the radiator 2400, and includes guide grooves 2310 into which a plurality of light sources 2210 and the connector 2250 are inserted. The guide grooves 2310 correspond to a substrate of the light source 2210 and the connector 2250.

A surface of the member 2300 may be coated with a light reflective material. For example, the surface of the member 2300 may be coated with white paint. The member 2300 again reflects light, which is reflected by the inner surface of the cover 2100 and is returned to the light source module 2200, to the cover 2100. Accordingly, the light efficiency of the lighting system according to the embodiment may be improved.

For example, the member 2300 may include an insulating material. The connection plate 2230 of the light source module 2200 may include an electrically conductive material. Accordingly, the radiator 2400 may be electrically connected to the connection plate 2230. The member 2300 may be formed of an insulating material, thereby preventing the connection plate 2230 from being electrically shorted with the radiator 2400. The radiator 2400 receives heat from the light source module 2200 and the power supply part 2600 and radiates the heat.

The holder 2500 covers a receiving groove 2719 of an insulating part 2710 of an inner case 2700. Accordingly, the power supply part 2600 received in the insulating part 2710 of the inner case 2700 is closed. The holder 2500 includes a guide protrusion 2510. The guide protrusion 2510 has a hole through a protrusion 2610 of the power supply part 2600.

The power supply part 2600 processes or converts an electric signal received from the outside and provides the processed or converted electric signal to the light source module 2200. The power supply part 2600 is received in the receiving groove of the inner case 2700, and is closed inside the inner case 2700 by the holder 2500.

The power supply part 2600 may include a protrusion 2610, a guide part 2630, a base 2650, and an extension part 2670.

The guide part 2630 has a shape protruding from one side of the base 2650 to the outside. The guide part 2630 may be inserted into the holder 2500. A plurality of components may be disposed above one surface of the base 2650. For example, the components may include a DC converter converting AC power provided from an external power supply into DC power, a driving chip controlling driving of the light source module 2200, and an electrostatic discharge (ESD) protection device protecting the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be narrower than or equal to a width of the connection part 2750 of the inner case 2700. Terminals of a "+ electric wire" and a "− electric wire" are electrically connected to the extension part 2670 and terminals of the "+ electric wire" and the "− electric wire" may be electrically connected to a socket 2800.

The inner case 2700 may include a molding part therein together with the power supply part 2600. The molding part is prepared by hardening molding liquid, and the power supply part 2600 may be fixed inside the inner case 2700 by the molding part.

According to the embodiment, the light-emitting device having the optimal structure capable of enhancing the light intensity, the method of manufacturing the same, the light-emitting device package, and the lighting system can be provided.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims.

The invention claimed is:

1. A light-emitting device comprising:
a first conductive semiconductor layer;
a gallium nitride-based superlattice layer on the first conductive semiconductor layer;
an active layer on the gallium nitride-based superlattice layer;
a second conductive gallium nitride-based layer on the active layer; and
a second conductive semiconductor layer on the second conductive gallium nitride-based layer,
wherein the second conductive gallium nitride-based layer comprises a second conductive GaN layer having a first concentration, a second conductive $In_xAl_yGa_{(1-x-y)}N$ ($0<x<1$, $0<y<1$) layer having a second concentration and a second conductive $Al_zGa_{(1-z)}N$ ($0<z<1$) layer having a third concentration on the active layer, and
wherein the second conductive $Al_zGa_{(1-z)}N$ layer having the third concentration comprises:
a primary second conductive $Al_zGa_{(1-z)}N$ layer having the third concentration, which has an energy bandgap equal to or higher than an energy bandgap of a quantum wall of the active layer and in which the energy bandgap is gradually decreased from the active layer to the second semiconductor layer; and
a secondary second conductive $Al_zGa_{(1-z)}N$ layer having the third concentration, which has an energy bandgap equal to or higher than an energy bandgap of the quantum wall on the primary second conductive $Al_zGa_{(1-z)}N$ layer having the third concentration, and in which the energy bandgap is gradually increased.

2. The light-emitting device of claim 1, wherein the second conductive GaN layer having the first concentration is disposed between the second conductive $In_xAl_yGa_{(1-x-y)}N$ layer having the second concentration and the second conductive $Al_zGa_{(1-z)}N$ layer having the third concentration.

3. The light-emitting device of claim 1, wherein the second conductive $In_xAl_yGa_{(1-x-y)}N$ layer having the second concentration is disposed between the second conductive GaN layer having the first concentration and the second conductive $Al_zGa_{(1-z)}N$ layer having the third concentration.

4. The light-emitting device of claim 1, wherein the first concentration is higher than the second concentration and the third concentration.

5. The light-emitting device of claim 1, further comprising a secondary second conductive GaN layer having the first concentration disposed between the second conductive $Al_zGa_{(1-z)}N$ layer having the third concentration and the second conductive semiconductor layer.

6. The light-emitting device of claim 1, wherein the second conductive $Al_zGa_{(1-z)}N$ layer having the third concentration comprises a tertiary second conductive $Al_zGa_{(1-z)}N$ layer having the third concentration on the secondary second conductive $Al_zGa_{(1-z)}N$ layer having the third concentration, in which the bandgap energy of the tertiary second conductive $Al_zGa_{(1-z)}N$ layer having the third concentration is maintained.

7. The light-emitting device of claim 1, wherein the gallium nitride-based superlattice layer has a bandgap energy level which varies from the first conductive semiconductor layer toward the active layer.

8. A light-emitting device comprising:
a first conductive semiconductor layer;
a gallium nitride-based superlattice layer on the first conductive semiconductor layer;
an active layer on the gallium nitride-based superlattice layer;
a second conductive gallium nitride-based layer on the active layer; and
a second conductive semiconductor layer on the second conductive gallium nitride-based layer,
wherein the second conductive gallium nitride-based layer comprises a second conductive GaN layer having a first concentration, a second conductive $In_xAl_yGa_{(1-x-y)}N$ ($0<x<1$, $0<y<1$) layer having a second concentration and a second conductive $Al_zGa_{(1-z)}N$ ($0<z<1$) layer having a third concentration on the active layer, and
wherein the first concentration is higher than the second concentration and the third concentration, and the gallium nitride-based superlattice layer comprises:
a first-group gallium nitride-based superlattice layer having a first bandgap energy; and
a second-group gallium nitride-based superlattice layer having a second bandgap energy lower than the first bandgap energy on the first-group gallium nitride-based superlattice layer.

9. The light-emitting device of claim 8, wherein a difference between a first bandgap energy level and a second bandgap energy level is equal to or higher than a photon energy level of the gallium nitride-based superlattice layer.

10. The light-emitting device of claim 8, wherein the gallium nitride-based superlattice layer comprises a third-group gallium nitride-based superlattice layer having a third bandgap energy on the second-group gallium nitride-based superlattice layer.

11. The light-emitting device of claim 8, wherein the gallium nitride-based superlattice layer comprises an $In_xGa_{1-x}N/GaN$ ($0<x<1$) superlattice layer.

12. The light-emitting device of claim 11, wherein a concentration of In of the second-group gallium nitride-based superlattice layer is higher than a concentration of In of the first-group gallium nitride-based superlattice layer.

13. The light-emitting device of claim 8, wherein the first-group gallium nitride-based superlattice layer has a thickness thinner than a thickness of a second-group gallium nitride-based superlattice layer.

14. The light-emitting device of claim 8, wherein the first-group gallium nitride-based superlattice layer comprises a first-group well and a first-group barrier, and a thickness of the first-group well is equal to a thickness of the first-group barrier.

15. The light-emitting device of claim 8, wherein the second-group gallium nitride-based superlattice layer comprises a second-group well and a second-group barrier, and a thickness of the second-group well is equal to a thickness of the second-group barrier.

16. The light-emitting device of claim 15, wherein a third-group gallium nitride-based superlattice layer comprises a third-group well and a third-group barrier, and a thickness of the third-group well is equal to a thickness of the second-group well, and a thickness of the third-group well is thicker than a thickness of the second-group barrier.

17. The light-emitting device of claim 16, wherein a first conductive element is doped on the third-group barrier.

18. A light-emitting device comprising:
a first conductive semiconductor layer;
a gallium nitride-based superlattice layer on the first conductive semiconductor layer;
an active layer on the gallium nitride-based superlattice layer;
a second conductive gallium nitride-based layer on the active layer; and
a second conductive semiconductor layer on the second conductive gallium nitride-based layer,
wherein the gallium nitride-based superlattice layer has a bandgap energy level which varies from the first conductive semiconductor layer toward the active layer, and
wherein the gallium nitride-based superlattice layer comprises:
a first-group gallium nitride-based superlattice layer having a first bandgap energy; and
a second-group gallium nitride-based superlattice layer having a second bandgap energy lower than the first bandgap energy on the first-group gallium nitride-based superlattice layer.

19. The light-emitting device of claim 18, wherein the second conductive gallium nitride-based layer comprises a second conductive GaN layer having a first concentration, a second conductive $In_xAl_yGa_{(1-x-y)}N$ ($0<x<1$, $0<y<1$) layer having a second concentration and a second conductive $Al_zGa_{(1-z)}N$ ($0<z<1$) layer having a third concentration on the active layer,
wherein the second conductive $Al_zGa_{(1-z)}N$ layer having the third concentration comprises:
a primary second conductive $Al_zGa_{(1-z)}N$ layer having the third concentration, which has an energy bandgap equal to or higher than an energy bandgap of a quantum wall of the active layer and in which the energy bandgap is gradually decreased from the active layer to the second semiconductor layer; and
a secondary second conductive $Al_zGa_{(1-z)}N$ layer having the third concentration, which has an energy bandgap equal to or higher than an energy bandgap of the quantum wall on the primary second conductive $Al_zGa_{(1-z)}N$ layer having the third concentration, and in which the energy bandgap is gradually increased.

20. The light-emitting device of claim 18, wherein the gallium nitride-based superlattice layer comprises a third-group gallium nitride-based superlattice layer having a third bandgap energy on the second-group gallium nitride-based superlattice layer,
wherein the first-group gallium nitride-based superlattice layer comprises a first-group well and a first-group barrier, and a thickness of the first-group well is equal to a thickness of the first-group barrier,
wherein the second-group gallium nitride-based superlattice layer comprises a second-group well and a second-group barrier, and a thickness of the second-group well is equal to a thickness of the second-group barrier, and
wherein the third-group gallium nitride-based superlattice layer comprises a third-group well and a third-group barrier, and a thickness of the third-group well is equal to a thickness of the second-group well, and a thickness of the third-group well is thicker than a thickness of the second-group barrier.

* * * * *